United States Patent [19]

Fisher

[11] Patent Number: 4,644,192
[45] Date of Patent: Feb. 17, 1987

[54] PROGRAMMABLE ARRAY LOGIC WITH SHARED PRODUCT TERMS AND J-K REGISTERED OUTPUTS

[75] Inventor: Barbara J. Fisher, Palm Bay, Fla.

[73] Assignee: Harris Corporation, Melbourne, Fla.

[21] Appl. No.: 777,686

[22] Filed: Sep. 19, 1985

[51] Int. Cl.$^4$ .................. H03K 19/177; H03K 19/20
[52] U.S. Cl. ................. 307/465; 307/202.1; 307/466
[58] Field of Search ............. 307/202.1, 465–469; 340/825.83, 825.84; 364/716

[56] References Cited

U.S. PATENT DOCUMENTS

| | | | |
|---|---|---|---|
| 3,566,153 | 2/1971 | Spencer, Jr. .................. | 307/304 |
| 3,993,919 | 11/1976 | Cox et al. ..................... | 307/279 |
| 4,037,089 | 7/1977 | Horninger ..................... | 364/900 |
| 4,124,899 | 11/1978 | Birkner et al. ................ | 364/716 |
| 4,157,480 | 6/1979 | Edwards ....................... | 307/465 |
| 4,415,818 | 11/1983 | Ogawa et al. ................. | 307/465 |
| 4,422,072 | 12/1983 | Cavlan ......................... | 307/465 |
| 4,433,331 | 2/1984 | Kollaritsch ................... | 340/825.83 |
| 4,554,640 | 11/1985 | Wong ........................... | 307/465 |

Primary Examiner—John S. Heyman
Assistant Examiner—Margaret R. Wambach
Attorney, Agent, or Firm—Barnes & Thornburg

[57] ABSTRACT

A programmable logic circuit of the type known as a PAL (programmable array logic) incorporates a J-K register for each of the circuit outputs. The PAL includes a programmable array for generating products of selected input terms. The product terms available at the array outputs can be programmably allocated to either or both of the J and K inputs. The provision of isolating circuitry allows for simultaneous sharing of each product term by both the J and K inputs.

9 Claims, 2 Drawing Figures

PROGRAMMABLE ARRAY LOGIC WITH SHARED PRODUCT TERMS AND J-K REGISTERED OUTPUTS

BACKGROUND AND SUMMARY OF THE INVENTION

This invention relates generally to a programmable logic circuit and, more particularly, to a programmable array logic (PAL) circuit which incorporates a J-K register on each output.

U.S. Pat. No. 4,124,899 to Birkner, et al shows a programmable logic circuit which is referred to as a programmable array logic, or PAL, circuit. A PAL comprises a programmable array or matrix interconnecting a plurality of circuit inputs and the inputs to a plurality of AND gates. The outputs of the AND gates, which logically are products of selected polarities of selected inputs, are subgrouped and are nonprogrammably connected as inputs to individual, specified OR gates. The outputs of the OR gates are, logically speaking, sums of these product terms.

One architectural feature shown in U.S. Pat. No. 4,124,899 is the use of D type registers or flip-flops with each of the circuit outputs. The D registers are provided at the OR gate outputs and allow temporary storage of the sum of the product term produced. Additionally, a feedback path from the output of each register to the array may be provided. This arrangement forms a state sequencer which can be programmed to execute elementary sequences, such as count up, count down, shift, skip and branch.

Like the device shown in U.S. Pat. No. 4,124,899, other synchronous PAL's on the market today typically include D type edge-triggered registers. However, for sequential circuit design, a J-K register is a more flexible and advantageous component. Unfortunately, incorporation of a J-K register into the standard PAL circuit architecture would require either the addition of more product terms (PT's) for connection to the K input of the J-K register or, alternatively, division of the current allotment of PT's between the J and K inputs. The former approach increases the size and power consumption of the device and is, therefore, unattractive. The latter approach reduces the number of PT's per output available to the designer and, thus, is also unattractive.

An object of the present invention is to provide a PAL circuit architecture which incorporates J-K registers for sequential system design.

Another object of the present invention is to provide a PAL circuit architecture which incorporates J-K registers without requiring the addition of additional product terms for the K input of the register.

Yet another object of the present invention is to provide a PAL circuit architecture which incorporates J-K registers without requiring a reduction in the allocation of product terms per output for the J and K register inputs.

These objects are attained in a programmable logic circuit which includes an array having a plurality of inputs for receiving input terms and a plurality of outputs and circuitry for combining selected ones of the input terms to form product terms at each of the array outputs. A J-K register having a first output connected to the output of the logic circuit, and circuitry for selectively connecting each of the array outputs to either or both of the J and K inputs of the J-K register, are also included. In a preferred embodiment, the second (inverted) output of the J-K register is connected in a feedback arrangement as an input to the array.

The circuitry for selectively connecting each of the array outputs to the J and K register inputs comprises a programmable element serially connected to circuitry for electrically isolating the J and K inputs. In a preferred embodiment, the isolating circuitry includes a three-terminal device having a first terminal connected to the respective J or K input via a programmable element, a second terminal connected to a power source and a third terminal connected to the array output. In this preferred embodiment, the three-terminal device is a transistor having a control terminal (i.e., the third terminal) connected to the array output.

The J-K register may be selectively converted to a D register or a toggle register by on-chip programmable circuitry. For operation as a toggle register, the array is programmed to present identical sums-of-the-product terms to both J and K inputs of a given register. For operation as a D register, the array is similarly programmed, but the output connected to the K input is selectively inverted by an on-chip programmable inverter.

The PAL architecture of the present invention increases the effective number of PT's without increasing the actual total number. The isolation circuitry associated with each of the logic circuit outputs allows both J and K inputs of the register to share each of the product terms. Thus, the new PAL architecture increases the effective number of PT's and allows for incorporation of J-K registers without increasing device power consumption, degrading device speed, or reducing the allotment of PT's per output.

It should be noted that the programmable logic circuit of the present invention is intended to include devices which are mask programmable, as well as field programmable. In devices of the latter type, the programming feature of the present invention allows the user to recover from programming errors and make design changes without necessarily having to sacrifice the device. However, for particular high volume applications, a mask programmable device which incorporates J-K registers according to the present invention may be cost effective.

Other objects, advantages and novel features of the present invention will become apparent from the following detailed description of the invention when considered in conjunction with the accompanying drawings.

DETAILED DESCRIPTION OF THE DRAWINGS

Figure 1:
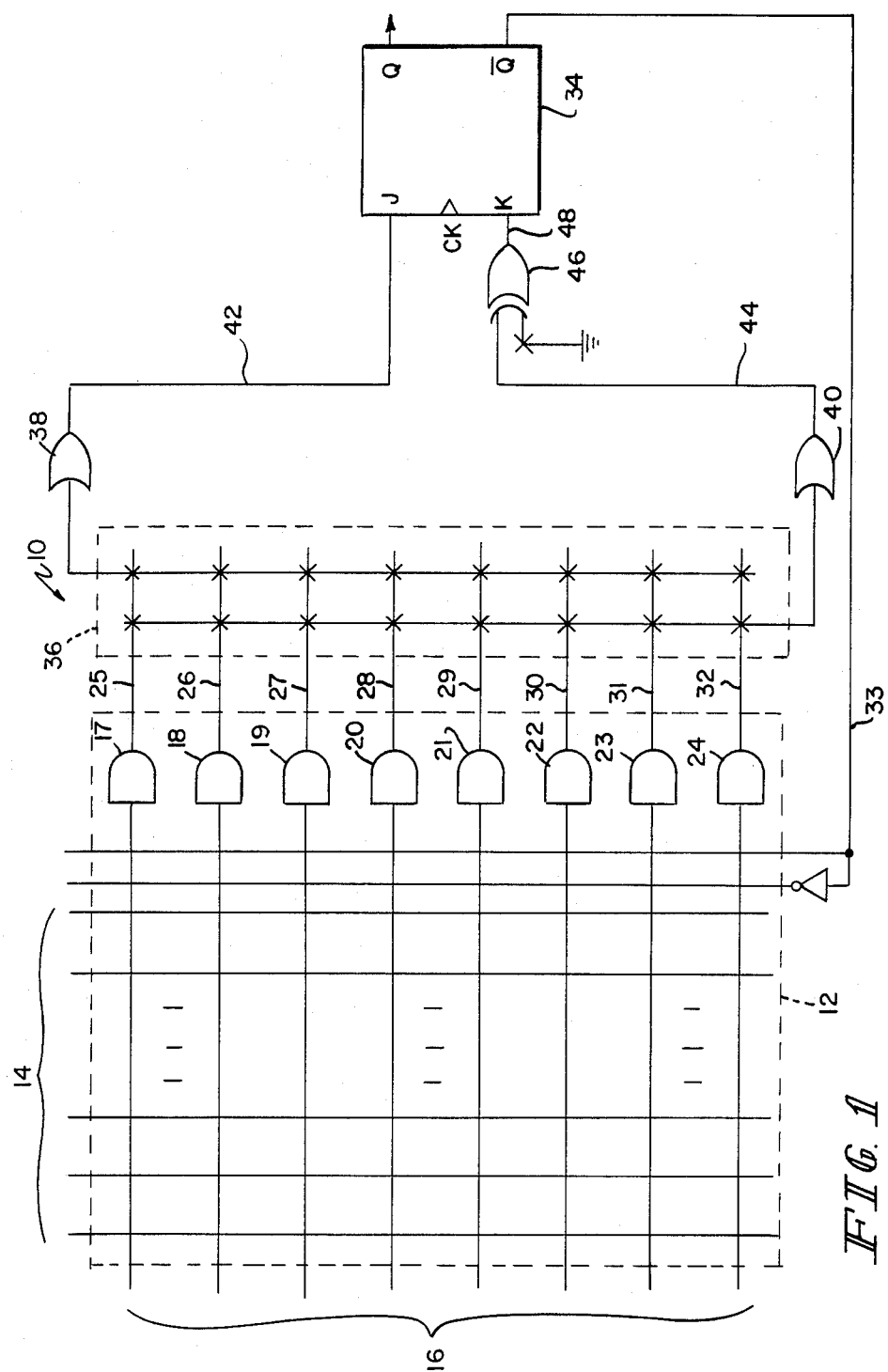
FIG. 1 shows a schematic diagram of a portion of a programmable logic circuit constructed in accordance with the present invention.

FIG. 1 shows a schematic illustration of a segment of a programmable logic circuit 10 constructed in accordance with the present invention. Logic circuit 10 includes an array 12 which, in the preferred embodiment shown, comprises a matrix of circuit input terms, indicated generally by reference numeral 14, and inputs 16 to a plurality of AND gates 17–24. Inputs 16 can be selectively connected to circuit input terms 14, depending upon the particular products terms required at each of the array outputs 25-32. The selective connection between input terms 14 and inputs 16 may be formed in the manufacturing process (i.e., the device may be mask-programmable). Alternatively, the matrix may be constructed in a field programmable form by providing fuse elements connected each input term 14 to each gate input 16. This approach leaves the final decision regarding the makeup of the product terms to the designer. For purposes of clarity, the "X's" which are normally used to indicate a fused or programmable connection between intersecting lines in the matrix (i.e., input terms 14 and AND gate inputs 16) are omitted in FIG. 1. Also included in the array is feedback line 33 from the $\overline{Q}$ output of J-K register 34, which may be programmable connected (in non-inverted or inverted form) to the lines of the array.

Outputs 25-32 of AND gates 17-24 comprise the outputs of array 12, at which are available the product terms generated by the array. In the portion of FIG. 1 defined by dotted line 36, each of the array outputs 25-32 is selectively (i.e., programmably) connectable to the inputs of either or both of the two OR gates 38 and 40. Output 42 or OR gate 38 is connected to the J input of J-K register 34. Output 44 of OR gate 40 is connected to the input of exclusive OR gate 46. Exclusive OR gate 46 has a second input which is programmably connected to ground. This arrangement forms a programmable inverter which allows output 44 of OR gate 40 to be inverted if the designer so wishes. A programmable inverter of this type is described in U.S. Pat. No. 4,157,480 to Edwards. Output 48 of exclusive OR gate 46 is connected to the K input of J-K register 34. This arrangement allows J-K register 34 to be converted to a D register by programming the inputs of OR gates 38 and 40 in an identical fashion, such that outputs 42 and 44 will be the same, and inverting output 44. If, under these conditions, output 44 is not inverted, then register 34 will operate as a toggle register. This feature is optional and register 34 may be operated as a J-K register (i.e., assuming non-identical programming of the J and K inputs) by not inverting output 44, or by eliminating exclusive-OR gate 46 all together.

Output Q of J-K register 34 is preferably connected to a device output terminal. The $\overline{Q}$ output of register 34 is preferably connected in a feedback arrangement, as shown in FIG. 1, and may be programmably connected to the inputs of AND gates 17-24. As noted, this arrangement forms a state sequencer which can be programmed to execute elementary sequences, such as count-up, count-down, skip shift, skip and branch.

In practice, a number of logic circuits, such as the one shown in FIG. 1, will be fabricated on a single chip and will form a single device. For example, a typical device may have 8-10 J-K registers. Thus, input terms 14 may be connected to the inputs of additional AND gates. The Q and $\overline{Q}$ outputs of the J-K registers may also be interconnected in the same manner as the outputs of register 34.

Figure 2:
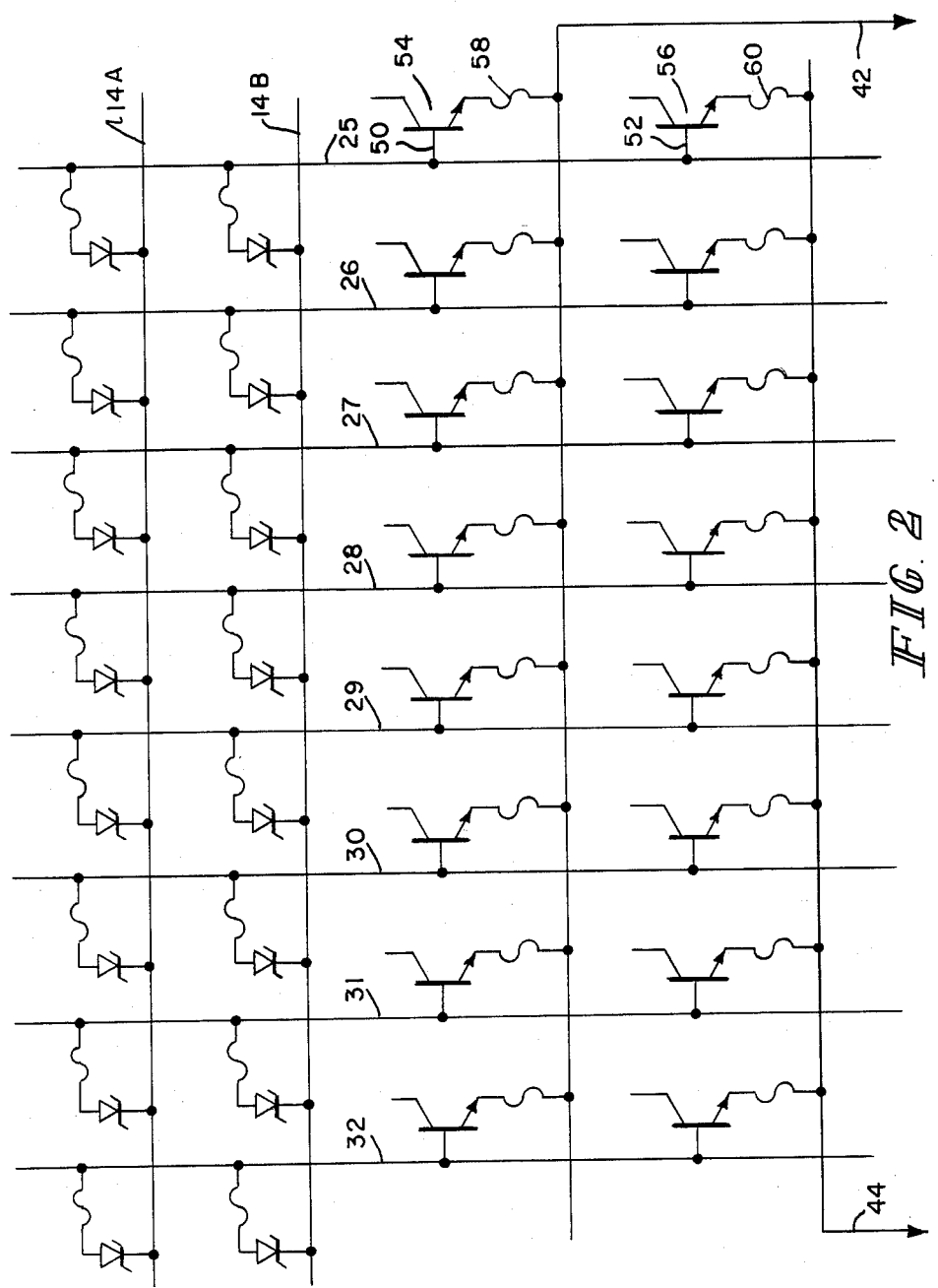
FIG. 2 shows a more detailed schematic of a portion of the programmable logic circuit of FIG. 1.

FIG. 2 shows a detailed implementation of a portion of logic circuit 10. In FIG. 2, the AND function is implemented by a programmable diode array, with the diode being provided as an isolation device. Inputs 14A and 14B, which represent two of the input terms 14 illustrated in FIG. 1, are connected to the current output end of a diode associated with each of the AND array outputs 25-32. The current input end of each diode is connected by a fusible link to each of the respective outputs 24-32. Thus, an output which remains connected by the fusible links to both inputs 14A and 14B will be pulled low if either (or both) of the inputs is low. If both inputs are high, the output will also be high and the product term AB will be indicated.

Each of the outputs 25-32 is connected to the control terminal (i.e., the base) of two transistors. For purposes of illustration, the detailed connection of the two transistors associated with array output 25 will be explained. The other outputs are similarly connected, although it should be readily apparent that one or both of the transistors could be omitted for selected array outputs if connection of that output to the respective outputs 42 and/or 44 is not required in a particular device.

Output 25 is connected to control terminals 50 and 52 of transistors 54 and 56, respectively. The emitter of transistor 54 is connected, via fusible element 58, to output 42. As noted in FIG. 1, output 42 is further connected to the J input of J-K register 34. The emitter of transistor 56 is similarly connected, via fusible element 60, to output 44. The collector of each transistor is connected to a power source to provide current for driving the respective outputs. Thus, when a select combination of product terms causes array output 25 to go high, transistors 54 and 56 are turned on and, if fusible elements 58 and 60 are intact, current is supplied to both of the outputs 42 and 44. Accordingly, the product term present at output 25 can be selectively applied to either the J or K inputs, or simultaneously to both inputs, by way of fusible elements 58 and 60. Similarly, each of the other array outputs 26-32 can be selectively connected to either or both outputs 42 and 44. The product terms available at each of the selected array outputs are thus summed at the respective outputs 42 and 44.

Transistors 54 and 56 serve to isolate output 42 from output 44 when array output 25 is connected to both outputs. The isolation provided by these transistors allows for the simultaneous sharing of a single product term present at each of the array outputs by both of the outputs 42 and 44. Accordingly, the effective number of product terms is increased.

The preceding description of a preferred embodiment of the invention is intended for purposes of example and illustration only, and is by no means intended to limit the scope of the present invention to the particular embodiment shown. For example, the number of array outputs, the allocation of particular outputs (product terms) to the J and K inputs, the device used to provide isolation (which may, for example, be a diode or an MOS device), and other details may all vary. Thus, the spirit and scope of the present invention is to be limited only by the terms of the appended claims.

What is claimed is:

1. A programmable logic circuit, comprising:
    an array having a plurality of inputs for receiving input terms and a plurality of outputs and means for combining selected ones of said input terms to form product terms at each of said array outputs;
    a J-K register having J and K inputs and at least one output; and
    logic means having inputs connected to the array outputs, and having first and second logic outputs connected to the J and K inputs respectively, for selectively connecting certain ones of said array outputs to either or both of the J and K inputs of said J-K register.

2. A programmable logic circuit according to claim 1, wherein said means for selectively connecting certain ones of said array outputs to said J input comprises a programmable element serially connected to means for electrically isolating said J and K inputs.

3. A programmable logic circuit according to claim 2, wherein said isolation means includes a three-terminal device having a first terminal connected to said programmable element, a second terminal connected to a power source and a third terminal connected to said array output.

4. A programmable logic circuit according to claim 3, wherein said three-terminal device is a transistor and said third terminal is a control terminal.

5. A programmable logic circuit according to claim 1, wherein said means for selectively connecting certain ones of said array outputs to said K input comprises a programmable element serially connected to means for electrically isolating said J and K inputs.

6. A programmable logic circuit according to claim 5, wherein said isolation means includes a three-terminal device having a first terminal connected to said programmable element, a second terminal connected to a power source and a third terminal connected to said array output.

7. A programmable logic circuit according to claim 6, wherein said three-terminal device is a transistor and said third terminal is a control terminal.

8. A programmable logic circuit according to claim 1, further comprising means for converting the J-K register to a D register.

9. A programmable logic circuit according to claim 1, further comprising means for converting the J-K register to a toggle register.

* * * * *